United States Patent [19]

Tatewaki et al.

[11] Patent Number: 5,800,864
[45] Date of Patent: Sep. 1, 1998

[54] OPTICAL DISC

[75] Inventors: Masayuki Tatewaki; Hiromasa Kato; Kenichi Obinata; Masahiro Aoki, all of Kanagawa, Japan

[73] Assignee: Sony Corporation, Tokyo, Japan

[21] Appl. No.: 17,977

[22] Filed: Feb. 12, 1993

Related U.S. Application Data

[60] Continuation of Ser. No. 834,612, Feb. 12, 1992, abandoned, which is a division of Ser. No. 667,829, Mar. 12, 1991, Pat. No. 5,186,994.

[30] Foreign Application Priority Data

Mar. 16, 1990 [JP] Japan ............................ 2-064387

[51] Int. Cl.$^6$ ............................................ B05D 5/06
[52] U.S. Cl. .................. 427/164; 427/162; 427/166; 427/255.3; 204/192.27
[58] Field of Search ............................ 427/166, 162, 427/164, 255.3; 204/192.27

[56] References Cited

U.S. PATENT DOCUMENTS

| | | | |
|---|---|---|---|
| 4,457,598 | 7/1984 | Shimabokuro et al. | 427/167 |
| 4,578,684 | 3/1986 | Gupta | 427/162 |
| 4,635,076 | 1/1987 | Wilson et al. | 427/404 |
| 4,651,172 | 3/1987 | Watanabe et al. | 427/162 |
| 4,786,538 | 11/1988 | Saito et al. | 428/64 |
| 4,933,239 | 6/1990 | Olson et al. | 428/557 |
| 4,959,243 | 9/1960 | Steininger | 427/250 |
| 5,055,356 | 10/1991 | Minowa et al. | 428/409 |

FOREIGN PATENT DOCUMENTS

| | | |
|---|---|---|
| 0 316 004 A2 | 5/1989 | European Pat. Off. . |
| 0 329 122 | 8/1989 | European Pat. Off. . |
| 0 354 564 | 2/1990 | European Pat. Off. . |

*Primary Examiner*—Janyce Bell
*Attorney, Agent, or Firm*—Limbach & Limbach L.L.C.

[57] ABSTRACT

An optical disc having an aluminum reflective film is disclosed, wherein an oxide of Al in the stable oxidized state is introduced into the Al reflective film to eliminate changes with lapse of time to improve durability of the optical disc. A method for producing a reflective film on an optical disc is also disclosed, wherein a trace amount of oxygen is introduced into atmosphere in the course of formation of the reflective film.

3 Claims, 2 Drawing Sheets

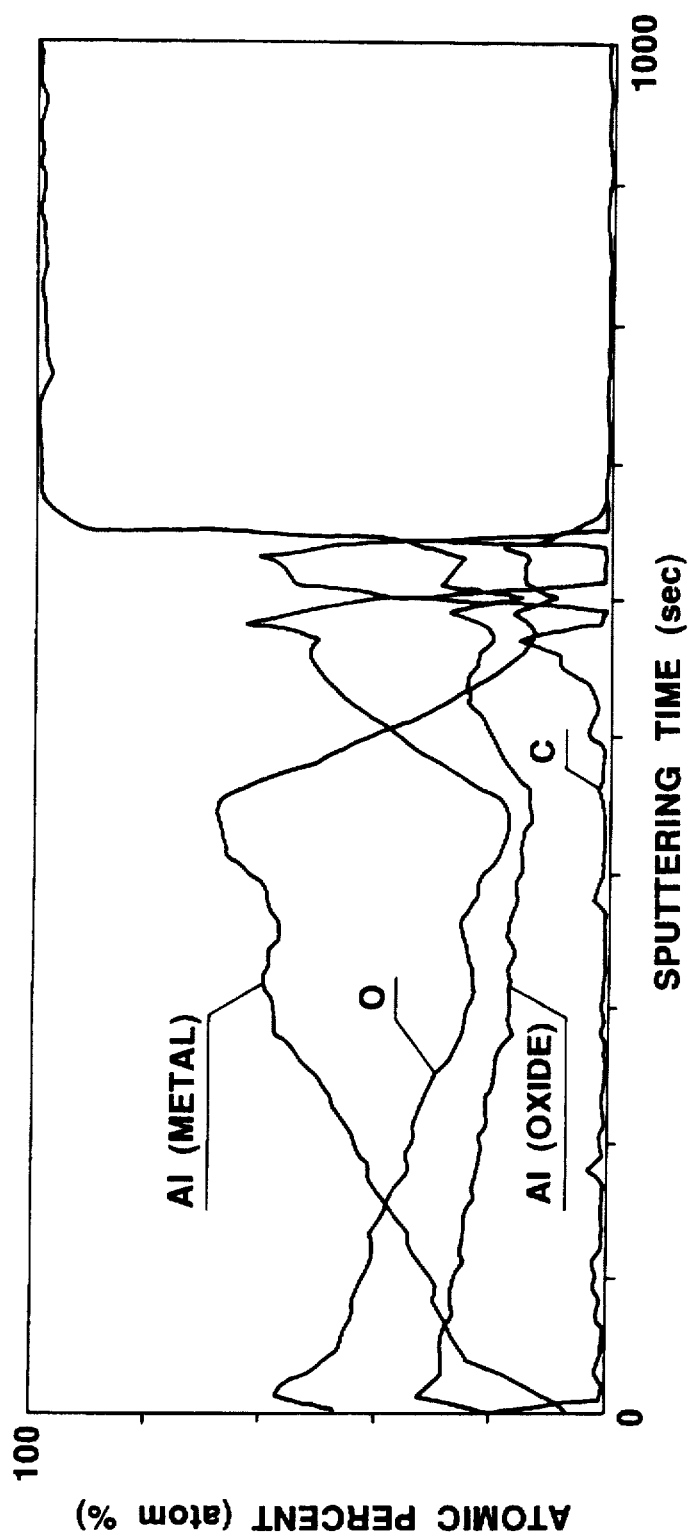

OPTICAL DISC

This is a continuation of application Ser. No. 07/834,612, filed on Feb. 12, 1992, now abandoned which is a division of application Ser. No. 07/667,829, filed on Mar. 12, 1991 now U.S. Pat. No. 5,186,994.

BACKGROUND OF THE INVENTION

1. Field of the Invention

This invention relates to an optical disc, such as a digital audio disc (so-called compact disc) or an optical video disc. More particularly, it relates to an improved optical disc having an the reflective film.

2. Description of the Prior Art

The optical disc, such as the digital audio disc or the optical video disc, is repaired by forming a refractive film on the transparent substrate, generally formed of polycarbonate or acrylic resin, and forming a hard protective film on the so-formed Al reflective film.

FIG. 1 shows the cross-section of this optical disc. The optical disc 1, shown in FIG. 1, is constituted by a transparent substrate 2, formed of a synthetic resin, such as polycarbonate or acrylic resin, by reason mainly of mass-producibility, as mentioned above, a reflective film 3 of aluminum or the like, formed on the substrate 2 by sputtering or evaporation, and a protective film 4 formed on the reflective film 3 for protecting the reflective film by spin coating a UV curable resin. In the case of a reproduce-only optical disc, such as a digital audio disc or an optical video disc, a pattern of projections and recesses, corresponding to the recorded signals, are formed on one surface of the transparent substrate 1, more correctly, on the surface thereof opposite to the signal reading surface, that is, on the surface thereof on which the reflective film 3 is formed. In the case of a write-once type optical disc on which information signals can be recorded, or an erasable optical disc, grooves are formed on the same one surface of the transparent substrate 1 as that of the reproduce-only optical disc. Although An may be used as the material for the reflective film 3, instead of Al, the latter is usually preferred because it is less expensive.

Besides being inexpensive, the Al film is superior in reflectivity and hence used extensively.

Meanwhile, the Al reflective film has a deficiency that the film of Al, being metal, is subject to changes with lapse of time on prolonged storage due to extraneous factors, and therefore leaves much to be desired.

For this reason, attempts have been made to form an oxide film on the surface of the Al reflective film by previous oxidation to provide an aluminum-aluminum oxide-aluminum three-layer structure to suppress deterioration with lapse of time.

However, this three-layer structure of the Al reflective film is also not fully satisfactory in durability because, if there be any flaw in the Al reflective film, corrosion tends to be started thereat to proceed into the metal aluminum of the mid layer of the three-layer structure.

OBJECT AND SUMMARY OF THE INVENTION

It is therefore a principal object of the present invention to provide an Al reflective film less susceptible to changes or deterioration with lapse of time, and an optical disc which, through the use of this Al reflective film, has superior durability.

The present inventors have conducted eager searches towards accomplishing the object and, above all, scrutinized into the film structure of the Al reflective film to check for the relation thereof with durability of the disc. As a result, the present inventors have arrived at a conclusion that an Al reflective film is more invulnerable to changes will lapse of time when it is of such a construction that an oxide is dispersed throughout the Al reflective film in its entirety.

The present invention has been fulfilled on the basis of this finding and provides an optical disc comprising a transparent substrate and a reflective film on said substrate, said reflective film being composed mainly of aluminum, wherein the reflective film contains an oxide of Al and wherein aluminum and oxygen constituting the oxide of Al bear an oxygen to aluminum atomic ratio of 1.3 or higher.

With the optical disc of the present invention, in which the oxide of Al is dispersed throughout the Al reflective film, the oxidized state of aluminum oxide is critical. Thus the oxide of Al needs to be a stable oxide. It can be checked from the aluminum to oxygen ratio in the oxide of Al whether or not the oxide of Al is stable. The stable oxide of Al herein means an oxide having the oxygen to aluminum atomic ratio of 1.3 or more. Conversely, the oxide is stable if the oxygen to aluminum ratio thereof is lesser than 1.3.

The state of the oxide of Al influences the durability of the Al reflective film significantly. If the oxide of Al is unstable, with the oxygen to aluminum atomic ratio being less than 1.3, it is difficult to suppress change with lapse of time even if the oxide is dispersed within the Al reflective film.

Thus, in accordance with the present invention, the oxide of Al is a stable oxide, with the oxygen to aluminum atomic ratio of the oxide of Al being 1.3 or higher for assuring the durability of the Al reflective film. Although there is no upper limit to the oxygen to aluminum atomic ratio, if it is not less than 1.3, there is a limit imposed by the chemical composition of the oxide, such that the ratio Al:O is preferably 1:1.3 to 1:2.0.

With the Al reflective film of the optical disc of the present invention, pure Al not bound with oxygen co-exists with the oxide of Al that is, Al bound with oxygen. Pure Al is necessitated to assure the reflectivity of the reflective film, while the oxide of Al is necessitated to suppress changes thereof with lapse of time. This needs to be considered in determining the amount of the oxide of Al in the Al reflective film It is practically desirable that the reflectivity of the Al reflective film is 70 percent or higher, and that the amount of the oxide of Al be such that changes with lapse of time of the Al reflective film may be suppressed to as low a value as possible. As the most preferred amount of the oxide of Al, pure Al and Al bound with oxygen are contained in the Al reflective film in relative amounts such that the amount of Al bound with oxygen accounts for substantially 26 to 33 atomic percent.

The above mentioned oxide of Al is produced by introducing a minor amount of oxygen into the atmosphere during formation of the Al reflective film by evaporation or sputtering. The amount of oxygen introduced into atmosphere may be determined, as a function of the rate of film formation or the like, so that the produced Al reflective film will satisfy the above mentioned requirements.

The Al reflective layer may be of an Al monolayer structure into which the oxide of Al is dispersed as described above, or may be so constructed that a thin oxide film is formed on the film surface and a larger amount of the oxide of Al exists near the film surface.

The present invention may be applied to any optical disc provided with The Al reflective film. Thus it may be applied not only to a digital audio disc or a video disc, but to a once-write type disc, such as a magneto-optical disc, or an overwrite type disc, provided that the disc is provided with the Al reflective film.

There is also no limitation to the substrate material and any well-known type material, including a transparent resin, such as acrylic resin or polycarbonate, may be employed.

With the oxide of Al in the stable state co-existing in the Al reflective film, it becomes possible to suppress changes with lapse of time and to improve the durability of the optical disc.

The reflectivity of the Al reflective film may be assured by pure Al (metallic Al) not bound with oxygen.

BRIEF DESCRIPTION OF THE DRAWINGS

FIGS. 2 and 3 are diagrams showing a density profile along the film thickness of an Al reflective film produced by evaporation under introduction of oxygen, wherein FIG. 2 shows the density profile before the accelerated deterioration test and FIG. 3 the-density profile after the accelerated deterioration test.

DETAILED DESCRIPTION OF PREFERRED EMBODIMENT

The present invention will be hereinafter explained or the basis of concrete test results.

First, Al was evaporated on a polymethyl methacrylate (PMMA) substrate, under introduction of oxygen, for forming an Al reflective film. The film thickness of the produced Al reflective film was of the order of 70 to 80 mm.

The produced Al reflective film was analyzed by an X-ray photoelectron spectrometry (XPS). The results are shown in FIG. 2.

With XPS, the kinetic energy of photoelectrons emitted from atoms upon irradiation of X-rays is sequentially measured to obtain an information concerning the constituent elements, the quantities and the state of bonding thereof. Thus the pure Al (metal Al) not bound with oxygen and Al bound with oxygen and thus existing as oxide may be quantitatively determined in isolation from each other. It is noted that argon ion sputtering was performed simultaneously for analyzing the Al reflective film along its depth.

Figure 1:
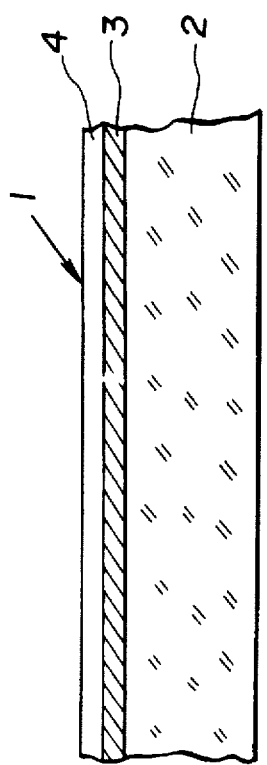
FIG. 1 is a cross-sectional view showing the general construction of an optical disc.
Figure 2:
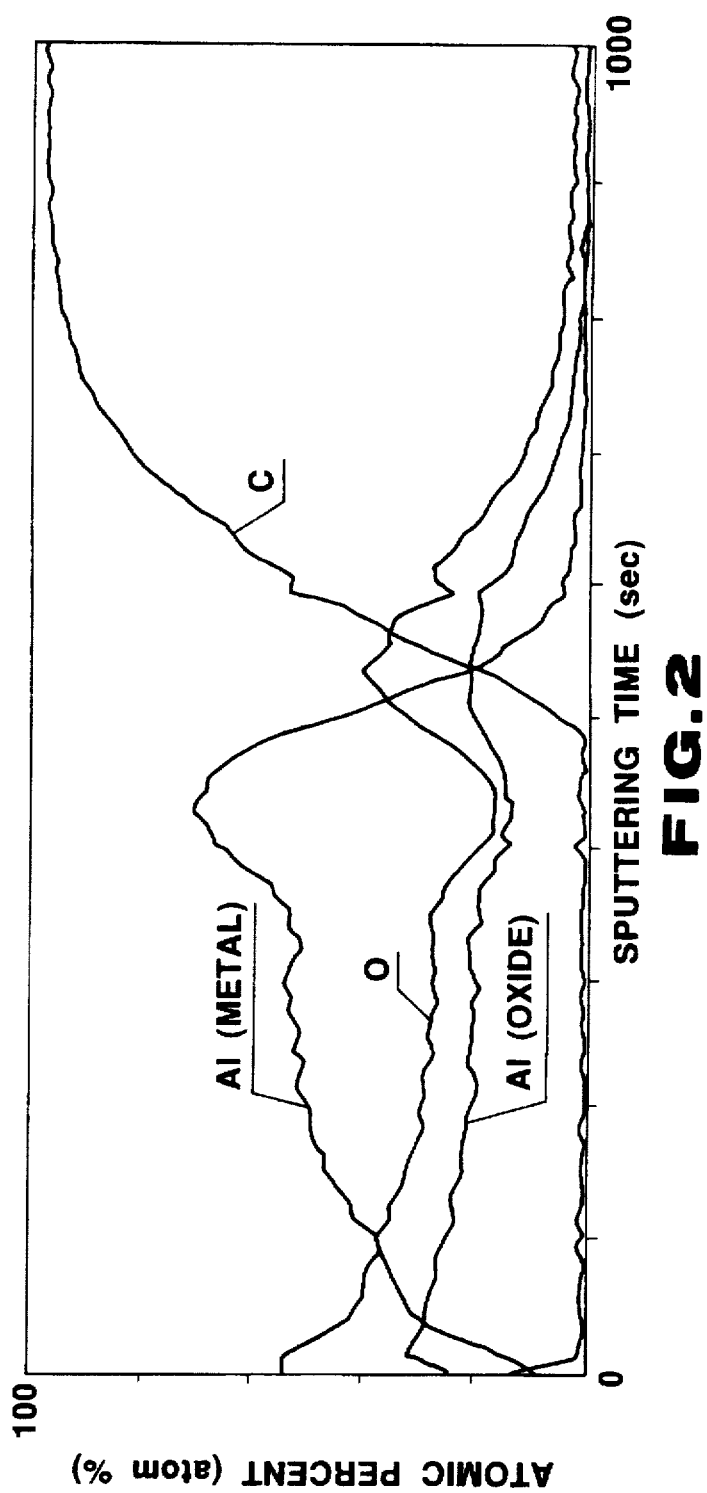

FIG. 2 shows the density profile of Al not bound with oxygen, referred to hereinafter as metal Al, Al bound with oxygen, referred to hereinafter as the oxide Al, oxygen and carbon, as measured along the thickness of the Al reflective film. In the drawing, the abscissa stands for the film thickness in terms of the sputtering time and the ordinate stands for the amounts of the respective elements in terms of atomic percent.

It is seen from FIG. 2 that the oxide of Al is contained in the Al reflective film evaporated under introduction of oxygen in an amount in the order of 30 atomic percent as Al. The O to Al atomic ratio O/Al in the oxide of Al is 1.3 or higher.

The optical disc, on which the Al reflective film has been formed in this manner, was put to an accelerated deterioration test to check for possible occurrence of changes with lapse of time. The conditions for the accelerated deterioration tests are the temperature of 60° C., the relative humidity of 85 percent and the test duration of 200 hours.

As a result, changes in the Al reflective film with lapse of time were scarcely observed even after the accelerated deterioration tests.

FIG. 3 shows the profile of the Al reflective film after the accelerated deterioration tests. It is seen from this figure that no changes are observed in the profile of the Al reflective film after the accelerated deterioration tests.

For comparison, similar tests were conducted on an optical disc on which the Al reflective film has been formed without introducing oxygen. A small amount of the oxide of Al was contained in the Al reflective film formed without introducing oxygen, the atomic ratio of O to Al O/Al in the oxide of Al being about equal to 1. Although substantially no changes were observed between the density profile before the accelerated deterioration test and that after the accelerated deterioration test, the Al reflective film after the accelerated deterioration test obviously underwent changes with lapse of time.

From the foregoing it is seen that the present invention provides an optical disc in which a stable oxide of Al co-exists in the Al reflective film to suppress changes of the Al reflective film with lapse of time to improve the durability of the optical disc.

In addition, the desired reflectivity of the Al reflective film may be assured by aluminum not combined with oxygen to improve the reflectivity of the optical disc.

What is claimed is:

1. A method for producing a reflective film essentially composed of aluminum on an optical disc, wherein aluminum oxide is interdispersed within the aluminum, said method comprising introducing an amount of oxygen into an atmosphere in the course of forming said reflective film on a transparent substrate of said optical disc wherein the amount of oxygen introduced into the atmosphere is such that the oxide of aluminum contained in the formed reflective film bears an oxygen to aluminum atomic ratio between 1.3 and 2.0.

2. A method of forming a reflective layer of aluminum having aluminum oxide dispersed therein on an optical disk comprising the steps of sputtering aluminum onto said disk in an atmosphere containing oxygen in an amount such that said aluminum oxide formed in said layer bears an oxygen to aluminum atomic ratio between 1.3 and 2.0.

3. A method of forming a reflective layer of aluminum on an optical disk having aluminum oxide dispersed therein comprising the steps of evaporating aluminum onto said disk in an atmosphere containing oxygen in an amount such that said aluminum oxide formed in said layer has an oxygen to aluminum atomic ratio between 1.3 and 2.0.

* * * * *